United States Patent
Griswold et al.

(10) Patent No.: US 9,069,051 B2
(45) Date of Patent: Jun. 30, 2015

(54) THROUGH TIME GRAPPA

(76) Inventors: Mark Griswold, Shaker Heights, OH (US); Nicole Seiberlich, Shaker Heights, OH (US)

(*) Notice: Subject to any disclaimer, the term of this patent is extended or adjusted under 35 U.S.C. 154(b) by 490 days.

(21) Appl. No.: 13/549,158

(22) Filed: Jul. 13, 2012

(65) Prior Publication Data

US 2014/0015527 A1  Jan. 16, 2014

(51) Int. Cl.
*G01R 33/48* (2006.01)
*G01R 33/561* (2006.01)
*G01R 33/563* (2006.01)

(52) U.S. Cl.
CPC ........ *G01R 33/4826* (2013.01); *G01R 33/5611* (2013.01); *G01R 33/56308* (2013.01)

(58) Field of Classification Search
CPC ........... G01R 33/4826; G01R 33/5611; G01R 33/56308
See application file for complete search history.

(56) References Cited

U.S. PATENT DOCUMENTS

| | | | |
|---|---|---|---|
| 7,576,536 B2* | 8/2009 | Akao et al. | 324/307 |
| 8,542,012 B2* | 9/2013 | Griswold et al. | 324/309 |
| 2011/0093233 A1* | 4/2011 | Griswold et al. | 702/106 |
| 2013/0088225 A1* | 4/2013 | Weller et al. | 324/307 |
| 2013/0207652 A1* | 8/2013 | Weller et al. | 324/309 |
| 2014/0292330 A1* | 10/2014 | Gulani et al. | 324/309 |
| 2014/0294734 A1* | 10/2014 | Gulani et al. | 424/9.32 |
| 2014/0296700 A1* | 10/2014 | Gulani et al. | 600/414 |

* cited by examiner

*Primary Examiner* — Dixomara Vargas

(57) ABSTRACT

Example apparatus and methods control a magnetic resonance imaging (MRI) apparatus to acquire, from an object to be imaged, throughout a period of time, a partitioned non-Cartesian fully-sampled calibration data set. Different groups of lines in the calibration data set are acquired at different points in time under different gradient encoding conditions that yield phase encoding in the direction perpendicular to the non-Cartesian encoded plane. The MRI apparatus is controlled to acquire an under-sampled non-Cartesian data set from the object to be imaged and to reconstruct an image from the under-sampled data set based, at least in part, on a through-time GRAPPA calibration. A GRAPPA weight set can be computed from data in different groups of lines in the calibration data set because different groups of lines can be treated as unique calibration time frames due to phase encoding produced by the different gradient encoding conditions.

24 Claims, 15 Drawing Sheets

THROUGH TIME GRAPPA

COPYRIGHT NOTICE

A portion of the disclosure of this patent document contains material that is subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

Some magnetic resonance imaging (MRI) applications desire both high resolution and high frame rates. Consider imaging a beating heart—high resolution would facilitate improved diagnosis while high frame rates would facilitate improved motion artifact avoidance by acquiring an image while the heart is at rest in between contractions. Motions other than heart contractions (e.g., respiration) can also complicate cardiac and other imaging. Therefore improvement in frame rates that do not sacrifice resolution, and improvements in resolution that do not sacrifice frame rates, are constantly being sought. One way to improve frame rates is to increase the degree of under-sampling.

Acquiring a magnetic resonance (MR) image may include acquiring both calibration data and image data. Acquiring adequate calibration data facilitates under-sampling image data and yet still achieving acceptable resolution. However, in some cases, acquiring fully-sampled calibration data sets may consume as much or more time than acquiring data for an MR image. Thus, applications like acquiring a full three dimensional (3D) multi-phase (CINE) data set of the heart in a single breath hold may be particularly challenging due, for example, to the time required to acquire fully-sampled data sets.

Conventionally, a single breath hold may only have allowed imaging a single slice of the heart. When multiple slices were required, multiple breath holds were required. Multiple breath holds may be challenging for patients that are having their heart imaged. Additionally, a patient may hold their breath differently on different breath hold attempts and thus images acquired during the different breath holds may be inconsistent. A further complication occurs as data is acquired further and further away from the time at which the calibration data was acquired.

High resolution and high frame rates are also sought after in dynamic MRI. Dynamic MRI (dMRI) involves creating a sequence of MR images to monitor temporal changes in an object of interest (e.g., tissue structure). dMRI apparatus seek to acquire images as fast as possible while maintaining a sufficient signal-to-noise ratio (SNR) to investigate the object being imaged.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
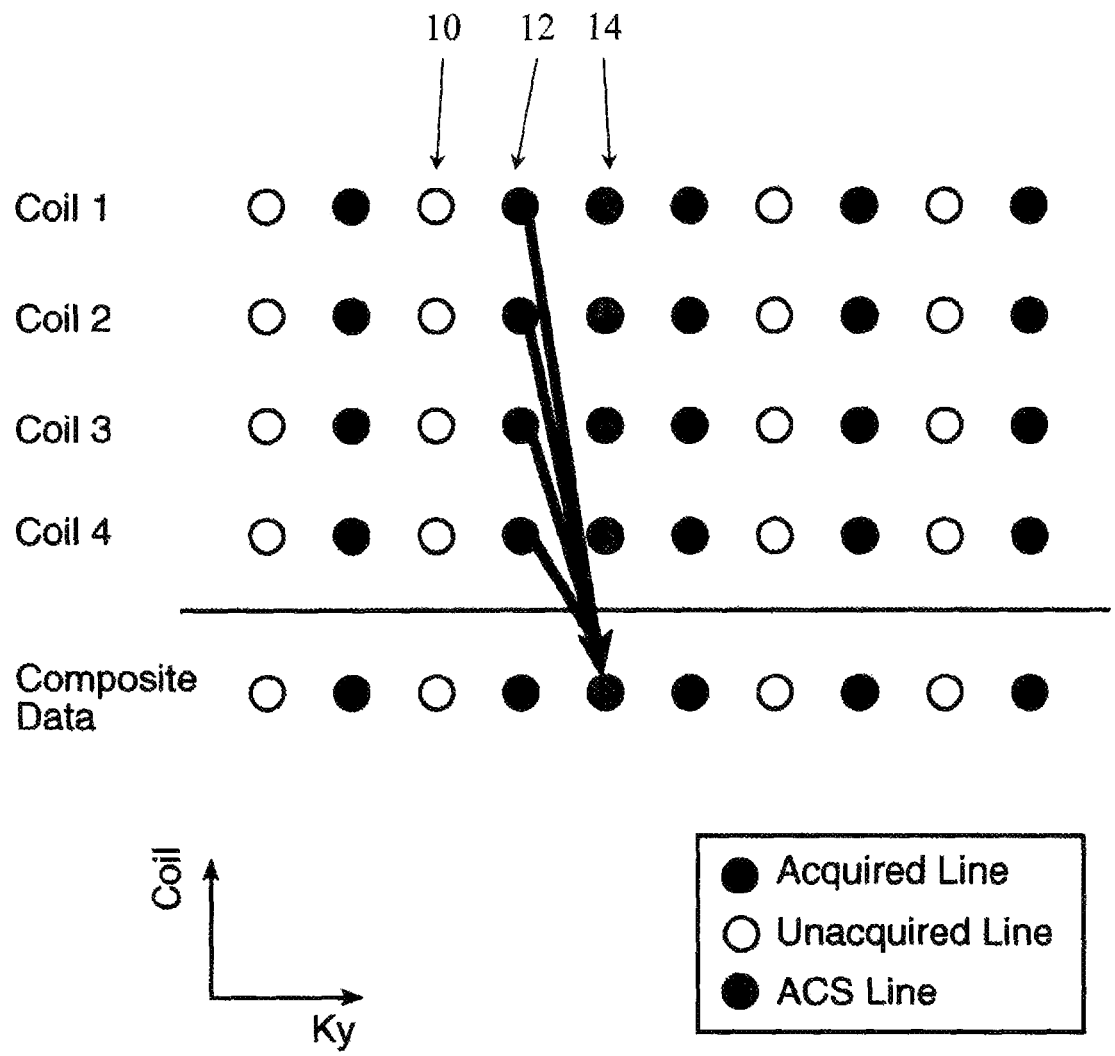
FIG. 1 illustrates basic reconstruction of data in a single coil.

Through-time GRAPPA facilitates achieving high frame rates and high resolution in applications like cardiac cine imaging. GRAPPA reconstruction depends on having useful GRAPPA weights to support the reconstruction. Computing a useful set of GRAPPA weights requires a threshold amount of differentiated calibration data. Differentiated calibration data is acquired from unique calibration frames. By applying a gradient in a direction perpendicular to a non-Cartesian encoded plane during acquisition of a fully-sampled calibration data scan, the data from the different applications of the perpendicular gradient or different partitions in the fully-sampled calibration data scan can be treated as unique calibration frames if at least three differences are produced in consecutive TRs. Therefore, fewer repetitions of the fully sampling calibration data scans are required to acquire the threshold amount of calibration data for computing GRAPPA weights. In one embodiment, consistently changing the perpendicular gradient in a known and controlled manner facilitates acquiring groups of lines having similar or identical gradients. While "lines" are described, one skilled in the art will appreciate that other acquisition elements (e.g., rays, spirals) may be similarly acquired.

Different groups of lines in a fully-sampled calibration data scan can be treated as unique calibration frames because example apparatus and methods control a gradient to change in a direction perpendicular to the non-Cartesian scan plane during the fully-sampled calibration scan. Changing the gradient may involve, for example, changing the gradient area. Because the gradient changes for groups of lines during the calibration scan, different groups of lines or divisions of the fully-sampled calibration data have different gradient encoding. In one example, groups of two neighboring lines may be acquired with the same or similar gradient. In other examples, groups of four, eight or other numbers of lines may be acquired. The different gradient encoding provides additional sensitivity information over and above the conventional 2D coil sensitivity information. The additional sensitivity information provides additional differentiated data from which GRAPPA weights can be computed. In one example, GRAPPA calibration may be achieved with only a single 3D fully-sampled calibration data scan. In another example, GRAPPA calibration may be achieved with only a single fully-sampled calibration data scan.

Even though groups in the fully-sampled calibration data scan are different, groups of lines in the fully-sampled calibration data scan can be reconstructed using the same GRAPPA weights. Example apparatus and methods recognize that the GRAPPA weights are the same or similar throughout a direction perpendicular to the non-Cartesian scan plane but are different in-plane (e.g., within a partition) due to the non-Cartesian trajectory for a group.

Example apparatus and methods acquire calibration data at different points in time and then perform a through-time GRAPPA calibration using the calibration data acquired at the different points in time. Useful calibration data can be derived from different groups of lines when the groups can be treated as separate time frames for the through-time calibration. The utility of the calibration data also depends on the calibration data being incoherent with image data acquired from a portion of an object that is moving. If the calibration is acquired using similar conditions at different times, then the calibration data may be synchronized with the portion of the moving object rather than being incoherent with the portion of the moving object. When a calibration dataset (e.g., stack-of-stars) is phase encoded in a direction perpendicular to the non-Cartesian encoded plane, different groups experience a different gradient in the direction perpendicular to the non-Cartesian scan plane. When the gradient is changed in an orthogonal direction through time, the effective appearance of different groups of lines is different. Since different groups of lines have different effective appearances, the different groups of lines can be used to calibrate for through-time GRAPPA.

By acquiring calibration data through time, multiple copies of each point or each collection of related points can be acquired. Using these multiple copies facilitates deriving a separate reconstruction kernel for desired reconstruction points in the raw data. Example apparatus and methods control the multiple copies to be incoherent with moving portions of an object. Because an exact kernel configuration can be calculated for a point, the resulting reconstruction kernel may support higher frame rates and resolution.

In one example, an under-sampled stack-of-stars dataset may be acquired in a segmented fashion during a single breath hold. The data set may be reconstructed using through-time GRAPPA. For the calibration, multiple groups of lines acquired over multiple repetitions may be used to calibrate the individual in-plane GRAPPA weights and the through plane data. This facilitates reducing the number of fully-sampled repetitions employed for the reconstruction.

The desire for high resolution and high frame rates has led to different techniques for both calibrating and acquiring image data. Before detailing how example apparatus and methods have achieved performance like acquiring a whole-heart stack of images at a frame rate of 48 ms/cardiac phase during a single breath hold, it may be appropriate to reflect on the science that lead up to this achievement.

Immediately preceding this through-time GRAPPA approach, different through-time non-Cartesian GRAPPAs were developed. For example, through-time radial GRAPPA and through-time spiral GRAPPA demonstrated desirable 2D image quality at temporal resolutions less than 50 ms. In some cardiac imaging examples, through-time non-Cartesian GRAPPA maintained better than 2×2×8 $mm^3$ spatial resolution without requiring EKG gating or breath holds. Unfortunately, these two-dimensional methods employed multiple fully-sampled data sets for calibrations. These multiple fully-sampled data sets took up to thirty seconds each to acquire. Directly porting these successful 2D techniques to three dimensions appeared to be attractive, but may have been physically impractical due to the time required to acquire multiple fully-sampled calibration data sets. For example, while conventional through-time non-Cartesian calibration could theoretically be applied to a three dimensional acquisition (e.g., 3D stack-of-stars dataset), using, for example, a partition-by-partition approach, acquiring multiple fully-sampled 3D data sets could take an undesirably long period of time (e.g., ten minutes).

At this point, a review of GRAPPA may be appropriate, to understand why fully-sampled data sets were initially required, and then how less than fully-sampled data sets became feasible, and then finally how the example apparatus and methods described herein achieved their performance with reduced numbers of fully-sampled calibration data sets and highly under-sampled image data.

GRAPPA is a technique that reconstructs in k-space by calculating missing k-space data based, at least in part, on information acquired from calibration data. In early GRAPPA, the calibration data came from auto-calibration signal (ACS) lines. In early GRAPPA, additionally acquired ACS lines $S_k^{ACS}$ were used to automatically derive a set of linear weights $n_k^{(m)}$. In early GRAPPA, missing k-space data was calculated from measured k-space data in light of the sensitivities and weights to form a complete, dense k-space, resulting in a full field of view (FOV) after Fourier transformation. Thus, the fundamental theory of early GRAPPA was that missing information could be derived from acquired information when the missing information had a defined and fixed relationship to the acquired information.

Figure one illustrates basic reconstruction of data in a single coil. The read-out direction is left to right. A single line of data may be acquired in each coil in an array of receive coils in a parallel MRI (pMRI) apparatus and then fit to an ACS line in the composite image. The fitting process determines the weights that transform a single line acquired in each of the individual coils into a single shifted line in the composite k-space matrix. The data acquired in each coil (black circles) are fit to the ACS line in a composite image (gray circle), which in most cases is the simple sum of the ACS lines acquired in each coil. By way of illustration, a missing line 10 in a Cartesian grid could be derived from one acquired neighboring line 12 with which the missing line 10 had a defined and fixed relationship when the acquired neighboring line 12 also had a defined and fixed relationship with ACS data 14. GRAPPA weights or operators could be determined between the acquired neighboring line 12 and the ACS data 14 and then employed to determine the data for the missing line 10. As GRAPPA matured, additional applications were developed.

Figure two illustrates a basic GRAPPA algorithm where more than one line acquired in the coils in the array were fit to an ACS line acquired in a single coil of the array. Figure two illustrates a missing line 20 being derived from acquired lines 22*a*, 22*b*, 22*c*, and 22*d* based on the relationships between acquired lines 22*a*-22*d* and ACS data 24. In the example illustrated, four acquired lines are used to fit a single ACS line in coil number four.

Uncombined images are generated for coils in the array by applying multiple block-wise reconstructions to generate the missing lines for the coils. A block may be defined as a single acquired line plus the missing lines adjacent to that line as shown on the right of FIG. 2. Data acquired in the coils of the array (black circles) are fit to the ACS line (gray circles). However, data from multiple lines from multiple coils may be used to fit an ACS line in a single coil. This fit gives weights that can then be used to generate the missing lines from that coil. Once the lines are reconstructed for a particular coil, a Fourier transform can be used to generate the uncombined image for that coil. Once this process is repeated for the other coils of the array, the full set of uncombined images can be obtained, which can then be combined using a sum of squares reconstruction.

To summarize, in early GRAPPA, component coil signals $S_k(k)$ were fit to a single component coil ACS signal. This procedure was repeated for the component coils. GRAPPA used multiple k-space lines from multiple coils to fit one single coil ACS line. This resulted in improved accuracy in the fit procedure over, for example, a system determined from external reference data (e.g., static maps of coil sensitivity). Reconstructed image quality depended directly on the quality of the GRAPPA weights, which in turn depended directly on the calibration data.

Figure 3:
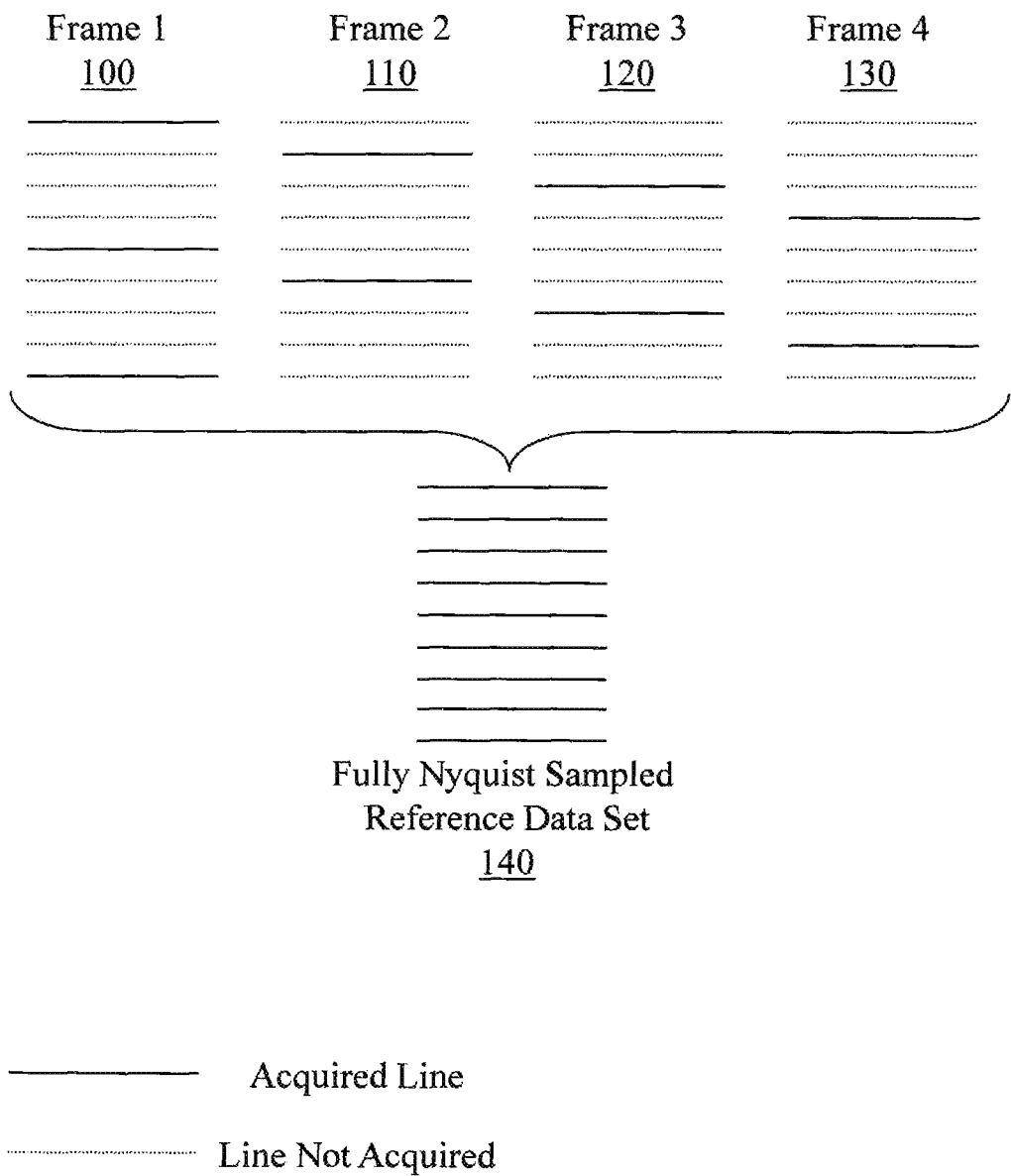
FIG. 3 illustrates acquiring a fully-sampled reference data set.

FIG. 3 illustrates acquiring a fully Nyquist sampled data set 140. The fully-sampled data set 140 is built from under-sampled frame1 100, under-sampled frame2 110, under-sampled frame3 120, and under-sampled frame4 130. As described above, acquiring multiple fully-sampled data sets may be impractical in applications like cardiac imaging and dMRI.

Figure 4:
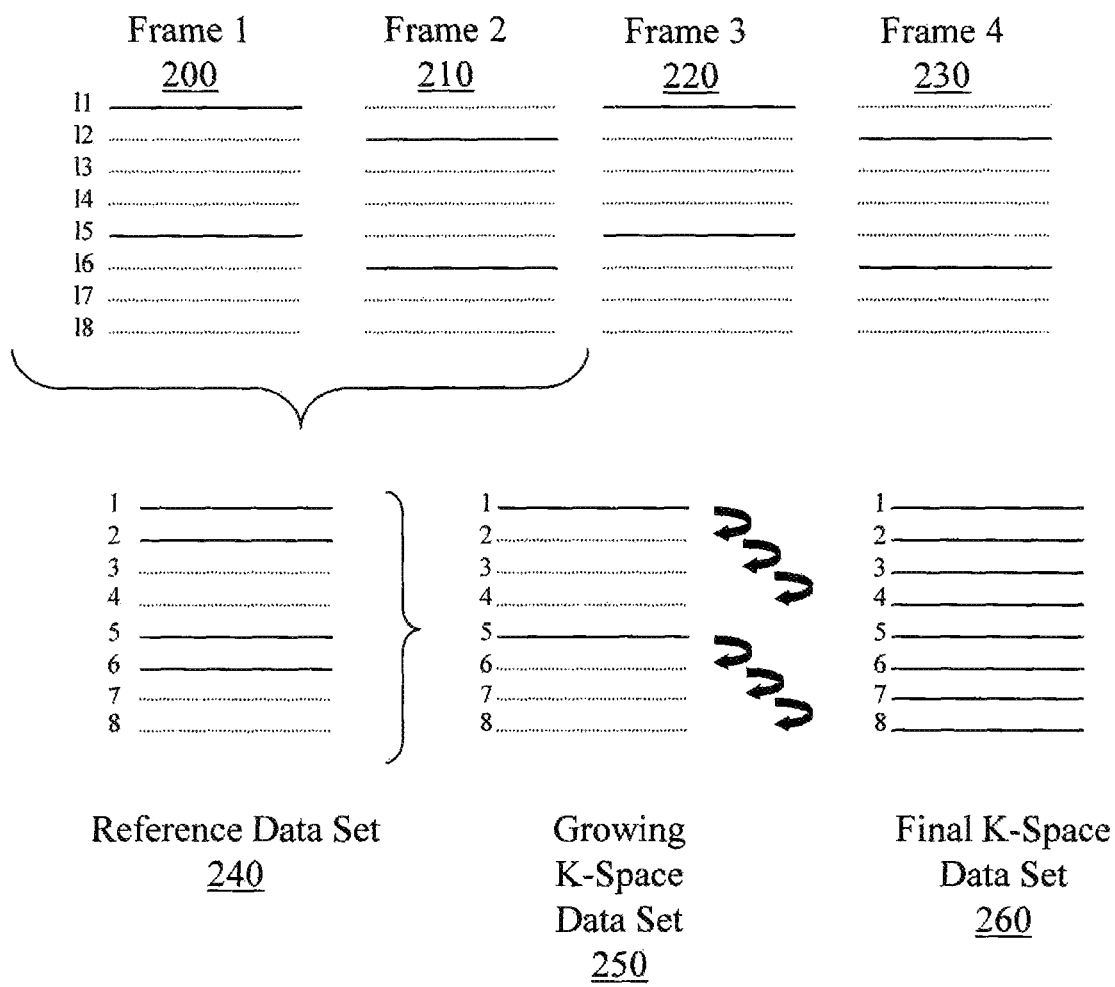
FIG. 4 illustrates acquiring an under-sampled reference data set through time.

In some cases, the time to acquire a sufficient number of fully-sampled data sets may exceed a desirable and/or acceptable period. Thus, GRAPPA calibration evolved to where missing data could be determined using a less than completely sampled reference data set, particularly when only certain geometries in a data set were of interest. FIG. 4 illustrates acquiring interleaved time frames and then using the GRAPPA-operator (Gopr) technique to determine missing data using a less than completely sampled reference data set. In FIG. 4, an incomplete reference data set 240 is assembled from just two time interleaved data sets (e.g., Frame1 200, Frame2 210). The under-sampling represented in FIG. 4 produces an acceleration factor of R=4. By analyzing the relationship between I1 and I2, information can be acquired to fill in missing lines (e.g., I3, I4, I7, I8). However, since information can also be acquired concerning the relationship between I5 and I6, that information may be used to fill in missing lines I7 and I8. One skilled in the art will appreciate that information from sets of neighboring lines can be employed to fill in missing lines elsewhere in the under-sampled data set.

FIG. 4 illustrates frame3 220 being acquired at a later time t3 and frame4 230 being acquired at a later time t4. Even though collected at a later point in time, frame3 220 collects the same lines as frame1 200 and frame4 230 collects the same lines as frame2 210. Therefore, calibration may be enhanced, even in an under-sampled data set, because a line may be sampled multiple times under different conditions. If conditions are identical at the different acquisitions, then there may not be additional information from which calibration improvements can be made. However, if conditions are not identical (e.g., different gradient conditions produce gradient encoding), then additional information may be available to improve and/or speed calibration. The different conditions may be produced, for example, by varying the gradient area in an amount sufficient to produce differences per TR. While a k-space "line" is described, it is to be appreciated that in different examples a "line" may refer to a set of points associated with a Cartesian acquisition or with a non-Cartesian acquisition.

To review, in GRAPPA, a missing k-space data point in a single coil can be reconstructed by a combination of acquired data points from other coils. The conventional one dimensional (1D) GRAPPA reconstruction is described by:

$$S(k_y + m\Delta k_y) = \hat{G}_{y,m} \cdot S(k_y), m = 1 \ldots (R-1)$$

The vector $S(k_y)$ contains the acquired signal associated with the k-space location $k_y$, the signal being received in $N_c$ coils. The vector $S(k_y)$ has the length $N_c$. The vector $S(k_y + m\Delta k_y)$, of length $N_c$, contains the reconstructed signals at location $k_y + m\Delta k_y$ in the $N_c$ coils.

The weighting matrix $\hat{G}_{y,m}$, with size $N_c \times N_c$, contains coil weighting factors. In conventional GRAPPA, a weighting matrix can be calculated if fully-sampled reference data are available such that $S(k_y)$ and $S(k_y + m\Delta k_y)$ are known for desired shifts m, by solving:

$$\hat{G}_{y,m} = S(k_y + m\Delta k_y) \cdot (S(k_y)^H S(k_y))^{-1} (S(k_y)^H)$$

However, this conventional GRAPPA approach required a complete set of reference data that satisfied the Nyquist criterion and, as described, above, acquiring multiple complete sets of reference data may be impractical in some applications. Therefore, techniques like two dimensional through time calibration were developed.

Two dimensional through time calibration used an incomplete reference data set (e.g., data set 240) to calculate reconstruction parameters based on fitting neighboring k-space lines (e.g., I1-2, I5-6). While analyzing the relationship between I1-2 in the reference data set 240 theoretically provided knowledge to do complete reconstruction in an under-sampled frame (e.g., fill I2-4, I6-8), there was also information available about a second relationship between I5-6 in the reference data set. Therefore, in one example that used all available information, the second relationship was also used to fill missing lines to facilitate computing reconstruction parameters. The computed reconstruction parameters were then applied to the raw data of an under-sampled individual frame (e.g., frame1 200) to grow a reference data set 250 by filling in missing lines and finally to obtain a final data set 260. While a complete data set 260 is illustrated, it is to be appreciated that a less than complete data set 260 may have been created by iteratively applying information gathered from relationships between lines in the under-sampled data space. Additionally, when parallel processing was available, reference data set 250 may have been grown in parallel.

GRAPPA reconstruction typically required a complete set of reference data for a shift in direction. By contrast, only one set of weights (reconstruction parameters) were needed by the Gopr technique to reconstruct a missing line from an acquired line. Only the single set of weights was used because GRAPPA reconstruction was reformulated as a matrix operator that shifts data in k-space. Once a first shift amount was determined, another shift amount was determined by repeated applications of the first shift amount. Thus, if a conversion was known for two neighboring (e.g., adjoining) lines, then a conversion for more distant lines could be determined from the known conversion. Thus, an entire (e.g., fully sampled) reference data set was not required.

Consider the following equation for determining a signal at a missing location $S_j(k_y + m\Delta k_y)$ based on an acquired signal:

$$S_j(k_y + m\Delta k_y) = \sum_{l=1}^{L} n(j, b, l, m) S_l(k_y + bA\Delta k_y)$$

$S_j(k_y)$ contains individual coil signals, n(j,b,l,m) represents reconstruction weights. The acquired signal at some position k in k-space in a coil j of the array is given by S(j,k). k is a vector that specifies the multi-dimensional location in k-space ($k_x$, $k_y$, $k_z$). For L coils, the 2D matrix is sized L×$N_k$, where $N_k$ is the total number of k-space points in the image. Thus, the GRAPPA formulation could be converted to:

$$S_{(j,k+\Delta k)} = G_1 S_{(j,k)}$$

where the set of weights $G_1$ corresponds to n(j,b,l,m) for b=1, m=1, so that the individual rows of the L×LG matrix are the GRAPPA weights used to reconstruct the shifted line $S_{(j,k+\Delta k)}$ in each respective coil.

These calculations were used to describe an infinitesimal shift to derive a set of weights $G_d$ with a small shift of δ. The generalization was described according to:

$$S_{(j,k+\delta)} = G_\delta S_{(j,k)}$$

With this generalized shift described, other shifts could then be made through multiple applications of the weights matrix $G_\delta$. Thus, the GRAPPA fit process could be manipulated to produce an operator for shifting data in k-space. For example, if $G_1$ shifts the signal by Δk, a shift by mΔk is achieved by applying $G_1$ m-times: $S_{(j,k+m\Delta k)} = (G_1)^m \cdot S_{(j,k)}$.

The Gopr approach was extended to three dimensional (3D) imaging with accelerations along the phase-encoding and the 3D-encoding direction. For 3D imaging, raw data from three individual under-sampled time frames was assembled to calculate a reference data set. Reconstruction parameters for a Gopr reconstruction were then computed from the reference data set.

Figure 5:
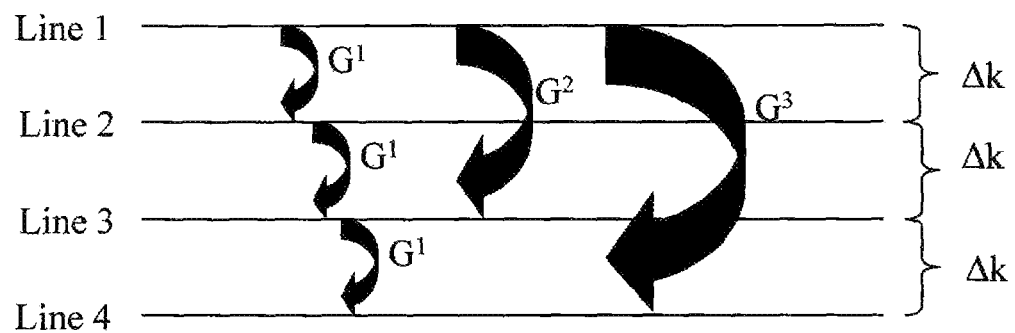
FIG. 5 illustrates applying a GRAPPA operator (Gopr).

FIG. 5 illustrates repetitive application of the Gopr to fill in distant (e.g., non-adjacent) missing lines. If a conversion from line 1 to line 2 is known, then the conversion from line 2 to line 3, and from line 3 to line 4 is also known. Additionally, a conversion from line 1 to line 3 and from line 1 to line 4 can be derived from the known conversion between line 1 and line 2. In applications that desire high frame rates and high resolution, fewer time interleaved frames may be employed when the Gopr approach is employed.

In some applications, non-Cartesian imaging has advantages over standard Cartesian imaging due, for example, to efficient k-space coverage or suppression of off-resonance effects. However, points acquired in a non-Cartesian approach do not necessarily fall onto a grid and thus have conventionally been re-sampled onto a Cartesian matrix before a Fourier transform is performed. One example gridding technique is the self-calibrating GRAPPA operator gridding (GROG) method. Using GROG, non-Cartesian MRI data is gridded using spatial information from a multichannel coil array without an additional calibration dataset. Using self-calibrating GROG, the non-Cartesian data points are shifted to nearby k-space locations using parallel imaging weight sets determined from the data points themselves. GROG employs the GRAPPA operator to perform these shifts.

Re-gridding has been employed in radial GRAPPA. Radial GRAPPA improves on conventional pMRI processing using non-Cartesian trajectories. An under-sampled non-Cartesian (e.g., radial) acquisition will not acquire every possible ray in a radial pattern. Assuming that 360 rays are available, one for each degree in a circle associated with a radial pattern, a fully-sampled data set would require a ray at multiple rotations (e.g., 0 degrees, 1 degree, 2 degrees). However, in an under-sampled radial acquisition, less than every ray would be acquired. For example, rays may be acquired at 0 degrees, 2 degrees, 4 degrees, and at other angles. Therefore there are rays missing at 1 degrees, 3 degrees, and at other angles. However, these missing rays can be filled in using conventional GRAPPA techniques. Similarly, an under-sampled spiral or other non-Cartesian acquisition will not acquire every possible "line".

Calibration data may be acquired according to a plan that acquires acquisition path elements that are in the same configuration as acquisition path elements that will be used in a reconstruction. When data is acquired through time, the reconstruction kernel may be exact for the acquisition path elements that are acquired multiple times through time.

By repeatedly acquiring calibration data for an acquisition path element throughout a period of time, a point in k-space to be solved for using the reconstruction kernel can be successfully reconstructed based on the high quality calibration data. Consider a calibration data set that acquires a calibration spiral for 0 degrees rotation and for 5 degrees rotation at several points in time. At each point in time there will be a spiral for zero degrees and a spiral for five degrees. While the calibration data set need not be fully-sampled, it will be configured to have the same configuration as the reconstruction kernel. This means that if a reconstruction will rely on spirals for 0 degrees, 5 degrees, 10 degrees, etc., then the calibration data set will acquire, through time, multiple copies of calibration data for the reconstruction kernel spirals. The reconstruction kernel constructed from these repeatedly acquired spirals can be very accurate. While spirals are described, one skilled in the art will appreciate that other non-Cartesian acquisition trajectories may be employed.

Figure 6:
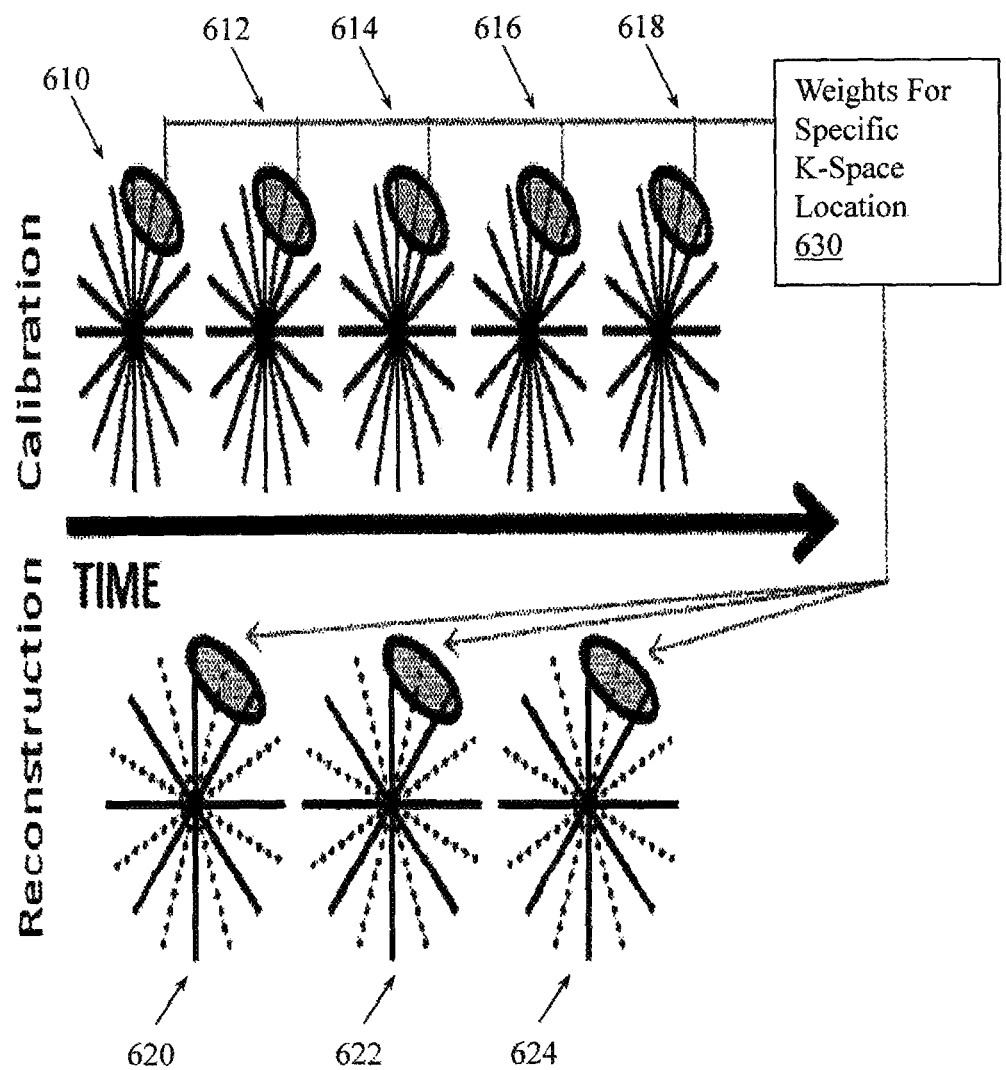
FIG. 6 illustrates 2D through-time calibration.

Performing a through-time GRAPPA calibration could also be referred to as calibrating the MRI with a set of calibration data acquired at different points over a period of time. FIG. 6 illustrates how 2D calibration data is acquired through time. FIG. 6 also illustrates how a 2D calibration data set is acquired and then an under-sampled data set is acquired. The under-sampled data set can be reconstructed using selected weights associated with calibration data acquired at different points in time. For example, a reconstruction can use weights from an immediately preceding calibration data set, from an immediately following calibration data set, from a combination of the before and after calibration data sets, from all the calibration data sets, and from other combinations. A weight set for each missing point can be calibrated and applied separately. While FIG. 6 illustrates a set of radial acquisitions, one skilled in the art will appreciate that other acquisition paths may be employed.

In one embodiment, the through-time calibration facilitates producing weights 630 for specific locations in k-space. The weights may be computed from portions of calibration data sets 610, 612, 614, 616, and 618. While five calibration data sets are illustrated, one skilled in the art will appreciate that a greater and/or lesser number of calibration data sets may be employed. The weights may then be employed to reconstruct under-sampled data sets 622, 624, and 626. In FIG. 6, the calibration data sets 610-618 are illustrated being interleaved with the under-sampled data sets 622-626. One skilled in the art will appreciate that in a different embodiment, the calibration data sets 610-618 could be acquired first and then the under-sampled data sets 622-626 could be acquired and reconstructed. This approach produced impressive improvements in 2D applications. However, as described above, the direct extension into 3D yielded unacceptably long calibration data acquisition times. Therefore example apparatus and methods use a different approach.

Figure 15:
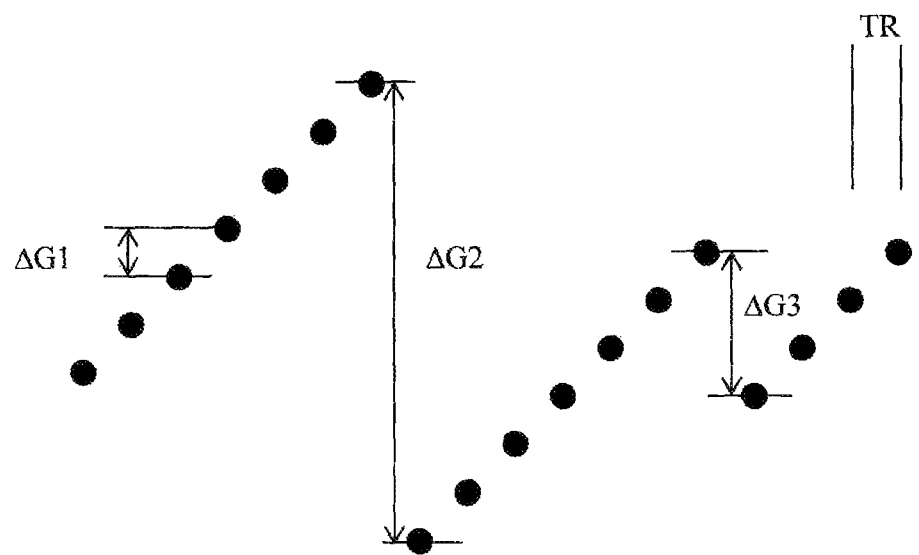
FIG. 15 illustrates a phase encoding gradient exhibiting at least three changes per repetition time (TR).

The different approach calibrates for GRAPPA using additional gradient-encoded sensitivity data. The additional gradient-encoded sensitivity information facilitates treating different data points in the fully-sampled calibration data as independent data because the apparent object is not identical in the different acquisitions. They are not identical because they have been phase encoded due to the application of different applied gradient moments during acquisition. In one example, the different phase encoding is produced by a gradient that is perpendicular to a non-Cartesian encoded plane in the object to be imaged. The different phase encoding may be produced by varying the gradient area from TR to TR in an amount sufficient to produce at least three differences in the phase encoding gradient. Consider FIG. 15, which illustrates three different TRs (TR1, TR2, TR3). Five points associated with the phase encoding gradient during TR1 are illustrated. Five points associated with the phase encoding gradient during TR2 are also illustrated. Note that at least the points X1, X2, and X3 differ between TR1 and TR2. Similarly, of the five points associated with the phase encoding gradient during TR3, at least points X4, X5, and X6 are different between TR2 and TR3. These differences facilitate having different sensitivity information and also facilitate producing incoherency between calibration data and image data associated with a moving portion of an object to be imaged. By consistently changing the perpendicular gradient at a known, controlled, or desired rate, a set of neighboring lines, rays, spirals or other acquisition elements may be acquired with the same or similar gradient. The set of elements can then be used for improved calibration.

Figure 7:
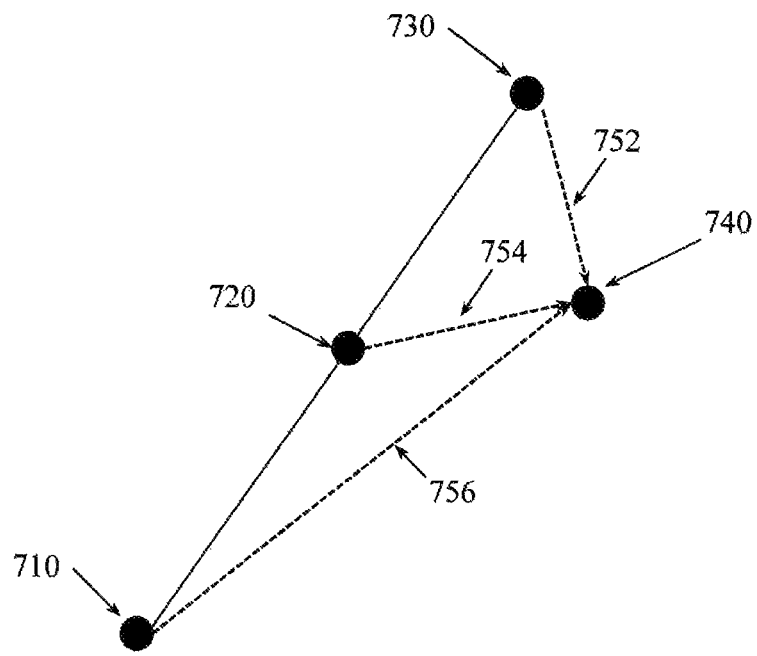
FIG. 7 illustrates an arrangement of points.

FIG. 7 illustrates four points of interest. Points 710, 720, and 730 may fall on a ray that is being acquired. Point 740 may be a point from a "missing ray". Information from points 710, 720, and 730 may be employed to fill in point 740. The arrangement of points 710, 720, 730, and 740 may appear only once in an entire data set. The relationships between points, as illustrated by 752, 754, and 756, may be constant during multiple acquisitions of the data for the ray on which points 710, 720, and 730 appear. Thus, no matter how many times the points are acquired under the same conditions, there will only be one set of information available for making a reconstruction kernel for point 740. However, when the points are acquired under the different conditions that are created during through-time GRAPPA by the gradient whose area is changing, then multiple pieces of information may be available for making a reconstruction kernel.

Figure 8:
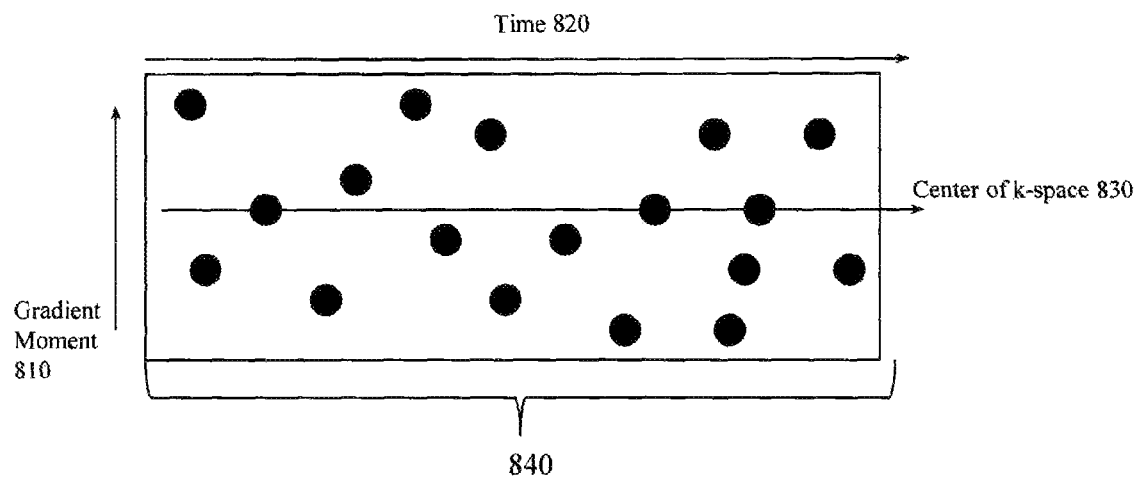
FIG. 8 illustrates processing associated with through-time GRAPPA.

FIG. 8 illustrates a data set 840 associated with through-time GRAPPA calibration and reconstruction. The data set 840 is acquired while a gradient 810 varies through a period of time 820. The gradient may vary in a manner sufficient to produce incoherence between calibration data and image data associated with a moving portion of an object. The gradient may vary in a manner similar to that illustrated in FIG. 15 so that there are at least three differences per TR. Various points in the data set 840 appear with different relationships to the center of k-space 830. Since data from dataset 840 is acquired at different points in time under different conditions, different groups of lines in of dataset 840 may have different applied gradient moments.

In one embodiment, a method may include controlling an MRI apparatus to acquire a calibration data set from an object to be imaged. The calibration data set is acquired while first, second, and third encoding gradients are active. The first and second encoding gradients are controlled to define a non-Cartesian encoded plane. The third encoding grading is configured as an encoding gradient that will vary in a direction perpendicular to the non-Cartesian encoded plane in the object to be imaged. The method may include controlling the MRI apparatus to apply the first and second gradients to create the non-Cartesian encoded plane and then to apply and vary the third gradient while acquiring the calibration data set. The method may include controlling the MRI apparatus to vary the third encoding gradient in an amount sufficient to produce three or more differences in the encoding gradient in consecutive acquisitions. The method may also include controlling the MRI apparatus to perform a through-time generalized auto-calibrating partially parallel acquisition (GRAPPA) calibration by computing a GRAPPA weight set from data in the calibration data set. Computing the GRAPPA weight set is based, at least in part, on data acquired while the first and second gradients are being applied to create the non-Cartesian encoded plane and on data acquired with different third gradients sufficient to produce unique calibration frames.

Figure 9:
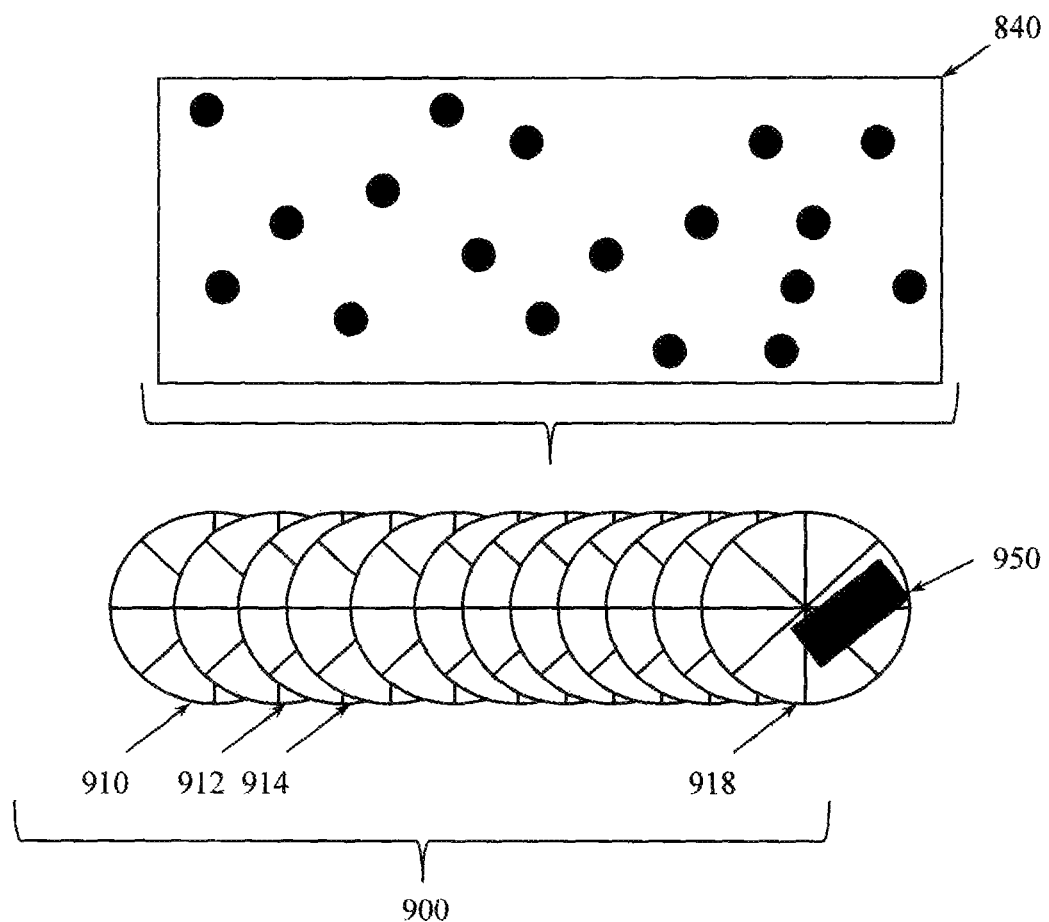
FIG. 9 illustrates processing associated with through-time GRAPPA.

FIG. 9 illustrates a group of similar data 900 in fully-sampled data set 840. Different data in the group 900 may have experienced different applied gradient moments and thus may have different information. For example, a group 910 may have experienced a first gradient at a first time and groups 912 and 914 through 918 may have experienced different gradients at different, later times. Because the different groups experienced different gradients, they may have been phase encoded in a direction perpendicular to the non-Cartesian scan plane. Even though the groups have different gradient encodings, they still have the same coil sensitivity information and can be reconstructed using the same GRAPPA weights. The weights will differ in-plane due to the non-Cartesian nature of the data, but they are the same for different sets acquired along a direction perpendicular to the non-Cartesian scan plane. However, the gradient encoding introduces additional sensitivity information that allows different groups to be treated as different time frames for GRAPPA calibration. This facilitates reducing the number of fully-sampled data sets that may be needed to determine useful GRAPPA weights.

In one embodiment, different members of the group 900 that may have been repetitively acquired under different conditions may be used to calibrate individual in-plane GRAPPA weights. In one example, different members of the group 900 may be used to generate GRAPPA weights for a single specific geometry in the in-plane portion of the trajectory. A single specific geometry could resemble, for example, the arrangement of points illustrated in FIG. 7. The single specific geometry could be associated with a region 950, for example. If the gradient was not different for different members of group 900, then there would only be one set of information available for processing point 740 from points 710, 720, and 730. But since the gradient is controlled to be different, then even though the same geometry was acquired multiple times, which conventionally would yield only one set of information, there are multiple sets of information available for processing point 740 from points 710, 720, and 730.

Figure 10:
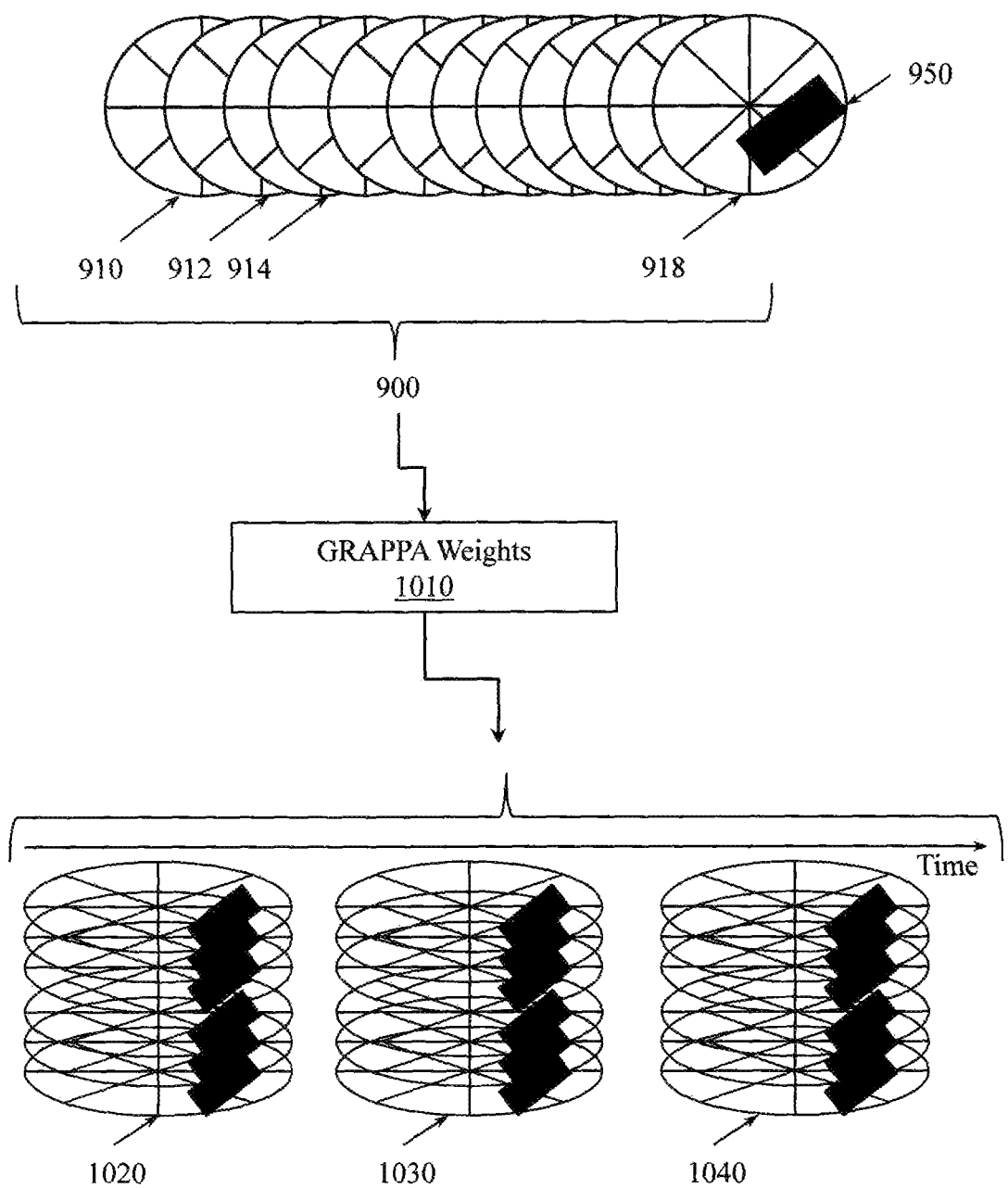
FIG. 10 illustrates processing associated with through-time GRAPPA.

FIG. 10 illustrates GRAPPA weights 1010 computed from members of the group 900. The gradient weights 1010 can be applied to the same geometry in the groups of an under-sampled dataset to reconstruct the missing projections. Missing projections could be reconstructed in, for example, frames 1020, 1030, and 1040. In one example, the weights 1010 could be applied to under-sampled cardiac CINE stacks-of-stars to reconstruct missing projections. Using groups with different gradient encoding in a GRAPPA calibration phase facilitates reducing the number of repetitions of the full dataset required for reconstruction because the gradient encoding does not interfere with coil sensitivities but instead offers additional independent sources of sensitivity information.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other disks. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and other embodiments. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

"Signal", as used herein, includes but is not limited to, electrical signals, optical signals, analog signals, digital signals, data, computer instructions, processor instructions, messages, a bit, a bit stream, or other means that can be received, transmitted and/or detected.

Figure 11:
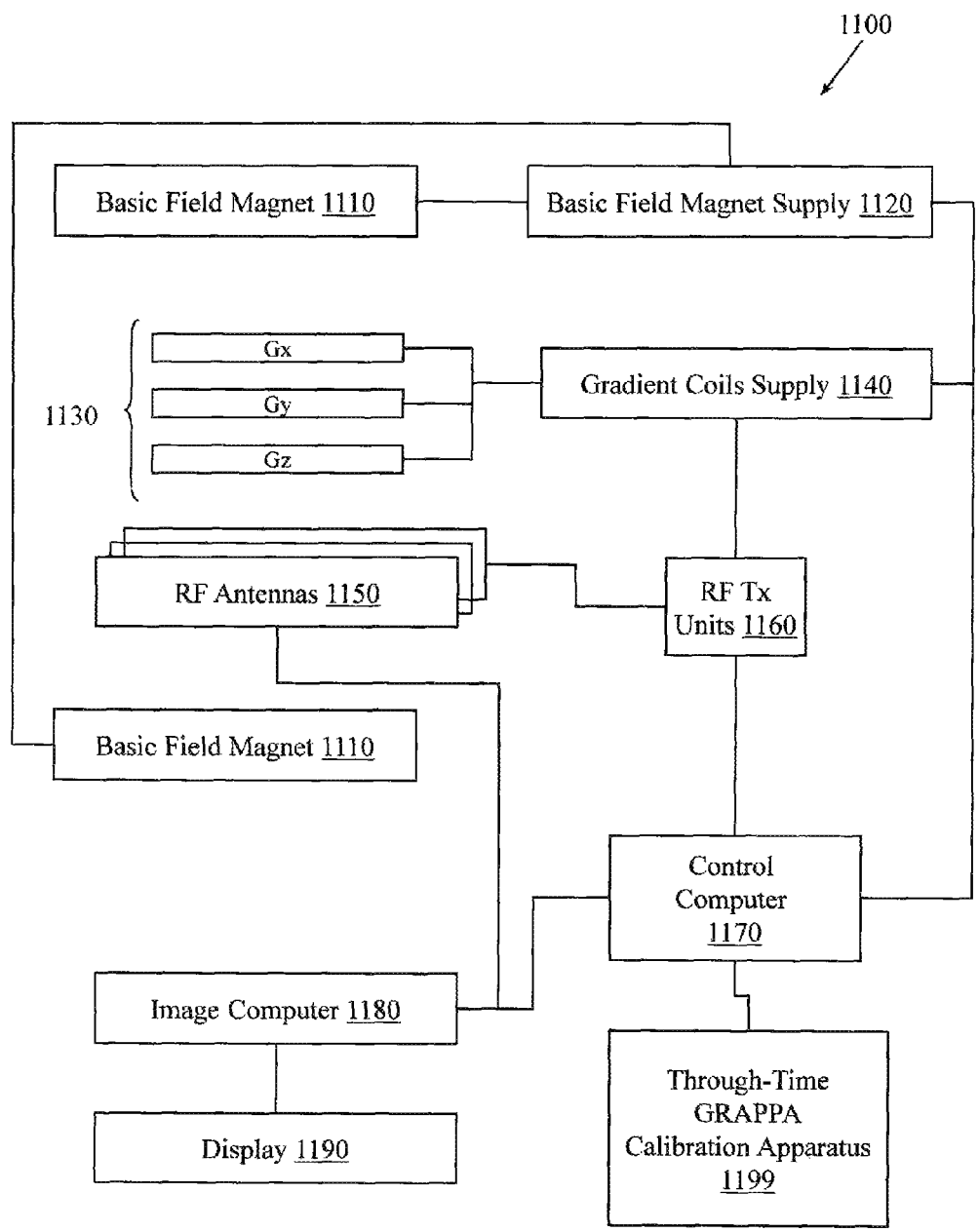
FIG. 11 illustrates an apparatus associated with through-time GRAPPA.

FIG. 11 illustrates an example MRI apparatus 1100 configured with a through-time GRAPPA calibration apparatus 1199. The apparatus 1199 may be configured with elements of example apparatus described herein and/or may perform example methods described herein. Thus, apparatus 1199 may control the gradient coils supply 1140 to gradient encode during acquisition of a fully-sampled calibration data scan. With appropriate gradient encoding during acquisition of the fully-sampled calibration data set, groups of lines in the fully-sampled calibration data scan can be treated as unique calibration frames. Therefore, fewer repetitions of the fully sampled calibration data scans are required to acquire the threshold amount of calibration data for computing GRAPPA weights.

Different groups of lines in the fully-sampled calibration data scans can be treated as unique calibration frames when apparatus 1199 controls a gradient to change in a known manner and direction during the fully-sampled calibration scan. Because the gradient changes in a direction perpendicular to the non-Cartesian scan plane during the calibration scan, different groups of lines of the fully-sampled calibration data have different gradient encoding. The different gradient encoding provides additional sensitivity information over and above the conventional coil sensitivity information. The additional sensitivity information provides additional differentiated data from which GRAPPA weights can be computed. In one embodiment, an apparatus 1199 is configured to calibrate apparatus 1100 in under 80 seconds and to then acquire a 3D cardiac cine data set in less than ten seconds (e.g., one breath hold).

The apparatus 1100 includes a basic field magnet(s) 1110 and a basic field magnet supply 1120. Ideally, the basic field magnets 1110 would produce a uniform $B_0$ field. However, in practice, the $B_0$ field may not be uniform, and may vary over an object being imaged by the MRI apparatus 1100. MRI apparatus 1100 may include gradient coils 1130 configured to emit gradient magnetic fields. The gradient coils 1130 may be controlled, at least in part, by a gradient coils supply 1140. In some examples, the timing, strength, and orientation of the gradient magnetic fields may be controlled, and thus selectively adapted during an MRI procedure.

MRI apparatus 1100 may include a set of RF antennas 1150 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 1150 may be controlled, at least in part, by a set of RF transmission units 1160. An RF transmission unit 1160 may provide a signal to an RF antenna 1150.

The gradient coils supply 1140 and the RF transmission units 1160 may be controlled, at least in part, by a control computer 1170. In one example, the control computer 1170 may be programmed to control a pMRI device as described herein. The magnetic resonance signals received from the RF antennas 1150 can be employed to generate an image and thus may be subject to a transformation process. The transformation can be performed by an image computer 1180 or other similar processing device. The image data may then be shown on a display 1190. While FIG. 11 illustrates an example MRI apparatus 1100 that includes various components connected in various ways, it is to be appreciated that other MRI apparatus may include other components connected in other ways.

Figure 12:
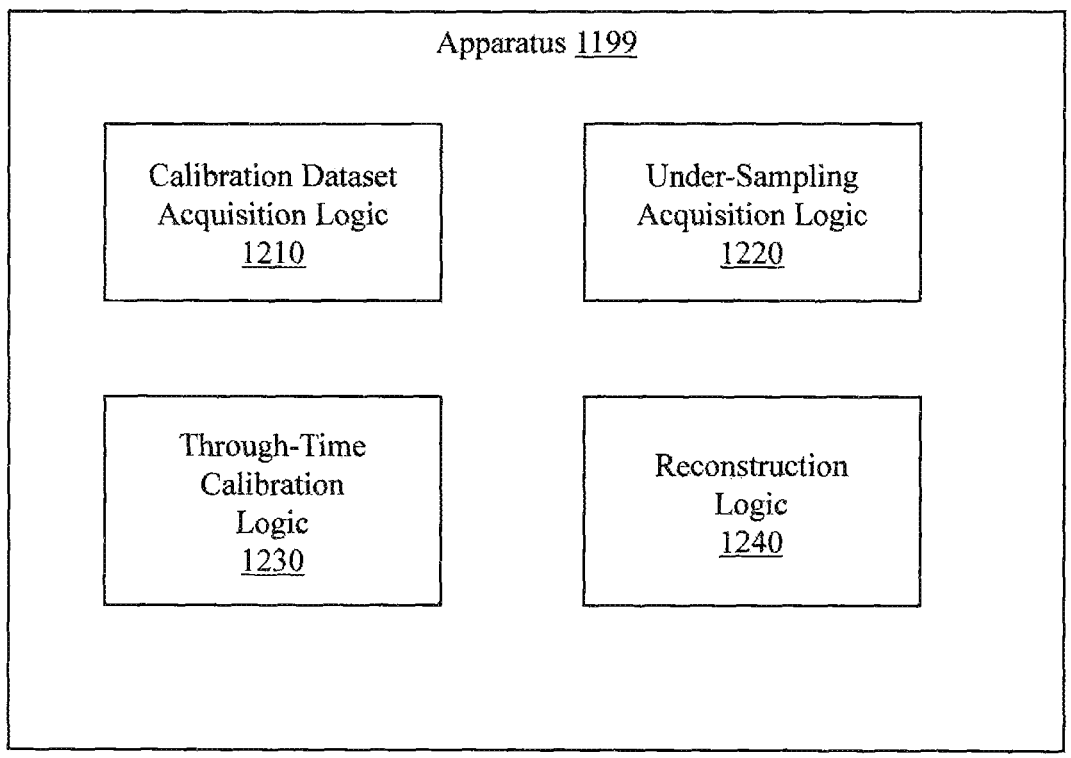
FIG. 12 illustrates an MRI apparatus associated with through-time GRAPPA.

FIG. 12 illustrates one embodiment of apparatus 1199. The embodiment of apparatus 1199 illustrated in FIG. 12 includes a calibration dataset acquisition logic 1210. Calibration dataset acquisition logic 1210 may include a first calibration logic and a second calibration logic. The first calibration logic may be configured to acquire a calibration data set from an object to be imaged. The first the calibration logic may be configured to control the MRI apparatus 1100 to produce first and second encoding gradients to define a non-Cartesian encoded plane. The first calibration logic may also be configured to control the MRI apparatus 1100 to produce a third encoding gradient that will vary in a direction perpendicular to the non-Cartesian encoded plane in the object to be imaged. The first calibration logic may also be configured to control the MRI apparatus 1100 to acquire the calibration data set while the non-Cartesian encoded plane is active and while the third encoding gradient is varying in an amount sufficient to produce three or more differences in the encoding gradient in consecutive acquisitions.

The second calibration logic may be configured to compute a GRAPPA weight set from data in the calibration data set where data acquired with different third gradients is treated as unique calibration frames.

Logic 1210 is configured to control an MRI apparatus (e.g., apparatus 1100) to acquire one or more calibration data sets. In one example, the calibration data sets may be fully-sampled while in another example the calibration data sets may be less than fully-sampled. In one example, the calibration data sets will be non-Cartesian (e.g., radial, spiral, rosette, stack of stars) data sets. Logic 1210 is configured to acquire groups of lines of the calibration data set at different points in time under different gradient conditions. While "lines" are described, different acquisition elements (e.g., rays, spirals) may be similarly acquired. The different gradient conditions may be produced, for example, by varying the gradient area from TR to TR in a manner and amount sufficient to generate at least three differences per TR.

The calibration dataset acquisition logic 1210 may be configured to control the MRI apparatus 1100 to acquire a calibration data set having groups of lines acquired under different conditions. The apparatus 1100 is controlled to acquire the different groups of lines of the calibration data set at different points in time under different gradient conditions. The gradient conditions are controlled to produce different phase encodings.

In one example, logic 1210 may be configured to acquire a non-Cartesian calibration data set that includes two or more acquisition path elements for which calibration data is acquired. The acquisition path elements may be selected, for example, based on reconstruction elements that will be used to reconstruct the image. Thus, the acquisition path elements will include at least the reconstruction elements that will be used by the reconstruction logic 1240 to reconstruct the image. The reconstruction elements will also be used by the through-time GRAPPA calibration logic 1230 to compute the GRAPPA weight set.

Apparatus 1199 also includes an under-sampling acquisition logic 1220. Under-sampling acquisition logic 1220 is configured to acquire an under-sampled data set from the object to be imaged. In one example, the under-sampled data set may be acquired using a non-Cartesian trajectory. Due to the through-time GRAPPA calibration described herein, under-sampling acquisition logic 1220 can, in some examples, acquire under-sampled data sets using acceleration factors including, for example, R=2, R=4, R=8, R=16, and other acceleration factors.

Apparatus 1199 also includes a through-time GRAPPA calibration logic 1230. Logic 1230 is configured to compute a GRAPPA weight set for a point missing from k-space in the under-sampled data set acquired by logic 1220. The GRAPPA weight set may be calibrated for the missing point and computed from data in the calibration data. In one embodiment, logic 1230 is configured to compute a value for a point missing from k-space in the under-sampled data using a GRAPPA weight set calibrated and applied for the missing point. In one example, the GRAPPA weight set may be computed from data selected from all of the groups in the calibration data set. In another example, the GRAPPA weight set may be computed from data selected from less than all of the groups in the calibration data set.

In one embodiment, logic 1230 can be configured to compute the GRAPPA weight set from all the elements acquired in the calibration data set(s). In another embodiment, logic 1230 can be configured to compute the GRAPPA weight set from less than all the elements acquired in the calibration data set(s).

Apparatus 1199 also includes a reconstruction logic 1240. Reconstruction logic 1240 is configured to reconstruct an image from the under-sampled data. The reconstruction will depend, at least in part on the GRAPPA weight sets.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic. The physical manipulations create a concrete, tangible, useful, real-world result.

It has proven convenient at times, principally for reasons of common usage, to refer to these signals as bits, values, elements, symbols, characters, terms, numbers, and other terms. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and other terms refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 13:
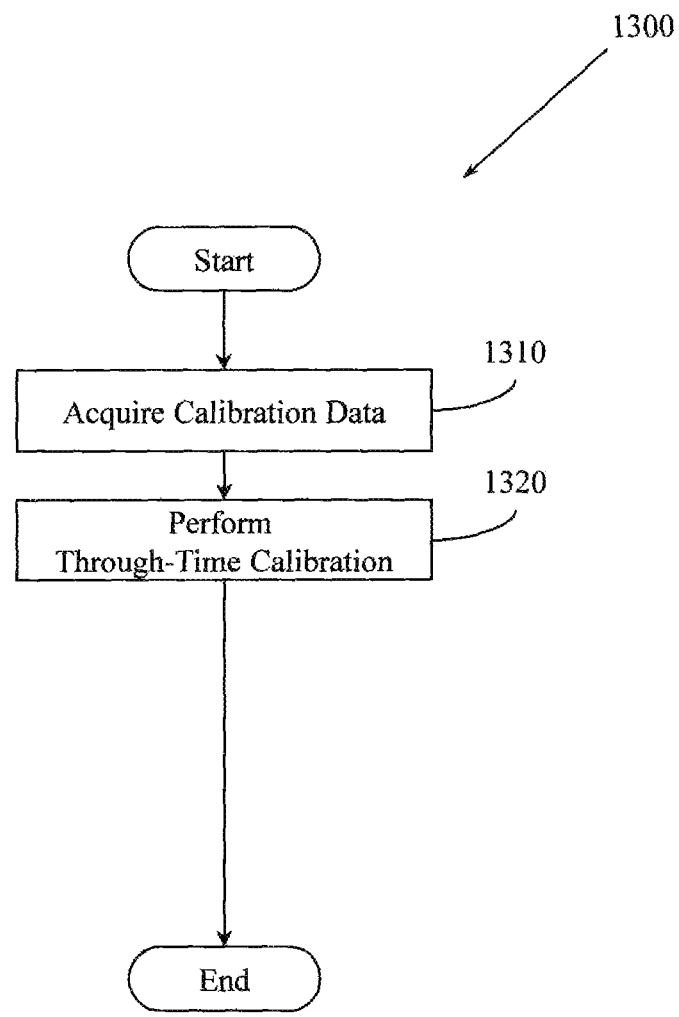
FIG. 13 illustrates a method associated with through-time GRAPPA.

FIG. 13 illustrates a method 1300 associated with through-time GRAPPA. Method 1300 includes, at 1310, controlling an MRI apparatus to acquire a calibration data set from an object to be imaged while a phase encoding gradient is active. The object to be imaged may be, for example, a beating heart, a region of a human vasculature in which blood is flowing, or other objects. In one example, the calibration data set is acquired from the object throughout a period of time during which the object may move or may be moved. By way of illustration, the object to be imaged may be a heart and the calibration data set may be acquired from a patient in a free-breathing, non-gated manner during multiple heartbeats and multiple respirations. The phase encoding gradient may be perpendicular to a non-Cartesian encoded plane present in the object to be imaged.

Method 1300 controls the MRI apparatus to acquire the calibration data set as a set of groups of lines in which a first member of the set of groups is acquired at a first time under a first gradient condition and a second member of the set of groups is acquired at a second time under a second, different gradient condition. While two groups are described, more generally N groups may be acquired at N different points in time under N different sets of conditions, N being an integer.

Controlling the MRI apparatus at 1310 includes controlling the MRI apparatus to create the first gradient condition and to create the second gradient condition while acquiring the calibration data set. The gradient condition is controlled by varying a gradient in a direction perpendicular to the non-Cartesian scan plane. The gradient is varied in a manner and amount sufficient to phase encode members of the set of groups in the direction perpendicular to the non-Cartesian plane. The gradient may be varied by, for example, varying the gradient area per TR. Adding the phase encoding to different groups to introduce the different gradient encoding sensitivity information facilitates treating different groups as unique time frames for through-time GRAPPA calibration.

In different examples the calibration data set may have different properties. In one example, the calibration data set may be a fully-sampled data set while in another example the calibration data set may be less than fully-sampled. Other properties and characteristics of the calibration data set can also be manipulated. For example, in different examples the calibration data may be associated with a radial acquisition, a spiral acquisition, a rosette acquisition, a stack of stars acquisition, or other acquisitions.

The calibration data set may also be acquired with particular geometries, regions, or other configurations of points in mind. Thus, in one example, the calibration data set may include two or more acquisition path elements for which calibration data is acquired. The acquisition path elements may be selected, for example, based on reconstruction elements that will be used to reconstruct the image. In one example, the acquisition path elements will include at least the reconstruction elements that will be used to reconstruct the image. The reconstruction elements will also be used to compute the GRAPPA weight set at 1320.

In one example, the calibration data set is an under-sampled data set. In this example, method 1300 may also include determining a GRAPPA-operator from a portion of the calibration data set and filling in a missing portion of the under-sampled data set using the GRAPPA-operator.

Method 1300 also includes, at 1320, controlling the MRI apparatus to perform a through-time GRAPPA calibration. In one example, controlling the MRI apparatus to perform the through-time GRAPPA calibration at 1320 includes computing a GRAPPA weight set from data in the calibration data set. Computing the GRAPPA weight set involves treating the first member of the set of groups as a first unique calibration frame and treating the second member of the set of partitions as a second unique calibration frame. The frames may be treated as unique calibration frames when, for example, varying the gradient area produces at least three differences per TR. The frames may also be treated as unique calibration frames when, for example, the calibration data is incoherent with image data associated with a moving portion of the object to be imaged.

With the multiple groups that can be treated as unique calibration frames available, performing the through-time GRAPPA calibration at 1320 may include computing a value for a point missing from k-space in the under-sampled data set using a GRAPPA weight set calibrated and applied for the missing point. In one example, the GRAPPA weight set may be computed from data selected from all of the data in the calibration data set while in another example the GRAPPA weight set may be computed from data selected from less than all of the data in the calibration data set.

In one example, a method may be implemented as computer executable instructions. Thus, in one example, a computer-readable medium may store computer executable instructions that if executed by a machine (e.g., processor) cause the machine to perform method 1300. While executable instructions associated with the method 1300 are described as being stored on a computer-readable medium, it is to be appreciated that executable instructions associated with other example methods described herein may also be stored on a computer-readable medium. One example computer-readable medium could store instructions for controlling a computer to control an MRI apparatus.

The instructions may control the MRI apparatus to acquire, from an object to be imaged, throughout a period of time, a non-Cartesian fully-sampled calibration data set. The instructions may control the MRI apparatus to acquire different groups in the calibration data set at different points in time under different gradient encoding conditions that may change from TR to TR. The instructions also include controlling the MRI apparatus to acquire an under-sampled non-Cartesian data set from the object to be imaged. The gradient encoding may be performed by a gradient that is perpendicular to a non-Cartesian encoded plane present in the object to be imaged. With the calibration data and the under-sampled data available, the instructions can also control the MRI apparatus to reconstruct an image of the object from the under-sampled non-Cartesian data set. The reconstruction is based, at least in part, on a through-time non-Cartesian GRAPPA calibration in which a value for a point missing from k-space in the under-sampled non-Cartesian data set is computed using a GRAPPA weight set. In one example, the GRAPPA weight set may be calibrated and applied for the missing point. The GRAPPA weight set may be computed from data in two or more portions of the non-Cartesian calibration data set. The two or more portions can be treated as unique calibration time frames with unique calibration information due to the different phase encodings produced by the different gradient encoding conditions created by varying perpendicular gradient in a direction perpendicular to the non-Cartesian scan plane.

Figure 14:
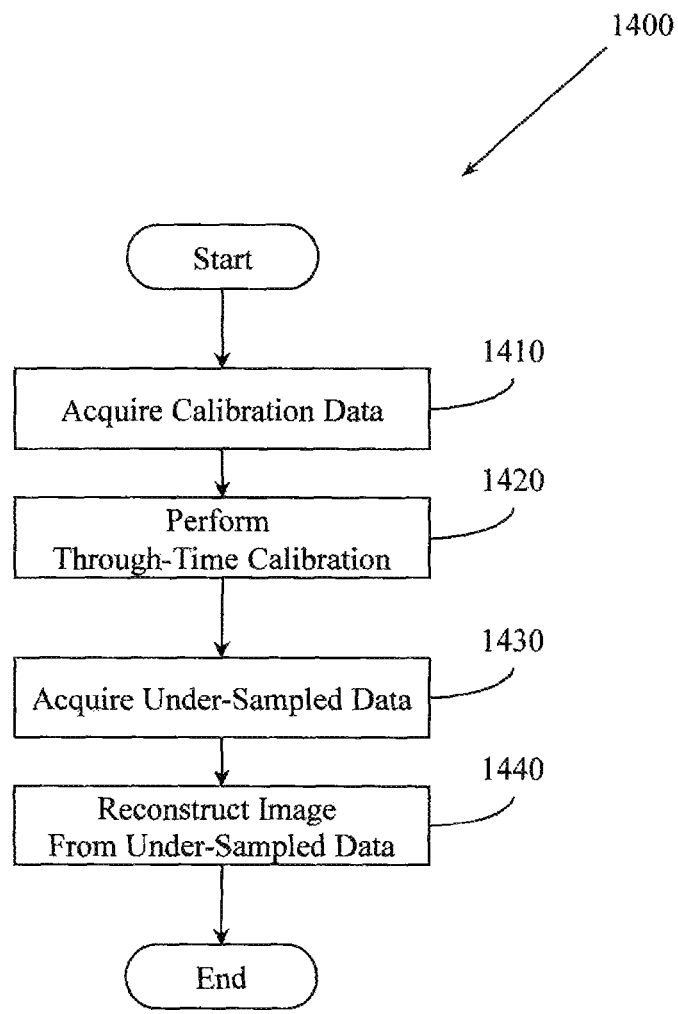
FIG. 14 illustrates a method associated with through-time GRAPPA.

FIG. 14 illustrates a method 1400 associated with through-time GRAPPA. Method 1400 includes operations similar to those in method 1300 (FIG. 13). For example, method 1400 includes acquiring calibration data at 1410 and performing a through-time GRAPPA calibration at 1420. However method 1400 includes additional actions.

Method 1400 includes, at 1430, controlling the MRI apparatus to acquire an under-sampled data set from the object to be imaged. In one example, the under-sampled data set is a cardiac cine data set. The under-sampled data set may be acquired with different degrees of under-sampling. In different examples the degree of under-sampling may be, 2, 4, 8, 16, or other degrees. In cardiac applications, it may be desirable to acquire the under-sampled data set in a single breath-hold. Therefore, in one example, method 1400 controls the acquisition of the under-sampled data set to occur in less than ten seconds and in another example method 1400 controls the acquisition to occur in less than five seconds. To further increase frame rates or to further reduce acquisition time, in one example, method 1400 may include controlling the MRI apparatus to acquire the under-sampled data set by using parallel imaging in a direction perpendicular to the non-Cartesian scan plane.

Method 1400 also includes, at 1440, controlling the MRI apparatus to reconstruct an image of the object to be imaged from the under-sampled data set. To reconstruct the image it may be necessary to compute a value for a point missing from k-space in the under-sampled data set. Thus, reconstructing the image at 1440 may include computing a value for the missing point using the GRAPPA weight set.

In one example, the MRI apparatus may be controlled at 1440 to reconstruct the image in real-time. Reconstructing in real-time may be desired in applications like cardiac imaging, blood flow imaging, and other applications.

While FIG. 14 illustrates various actions occurring in serial, it is to be appreciated that various actions illustrated in FIG. 14 could occur substantially in parallel. By way of illustration, a first process could acquire calibration data, a second process could acquire under-sampled data, a third process could perform a through-time GRAPPA calibration, and a fourth process could reconstruct an under-sampled image based on GRAPPA weights computed during the through-time GRAPPA calibration. While four processes are described, it is to be appreciated that a greater and/or lesser number of processes could be employed and that lightweight processes, regular processes, threads, and other approaches could be employed.

While example systems, methods, apparatus, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, apparatus, and other embodiments described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A non-transitory computer-readable storage medium storing computer executable instructions that when executed by a computer control the computer to perform a method, comprising:

controlling a magnetic resonance imaging (MRI) apparatus to acquire a calibration data set from an object to be imaged while first, second, and third encoding gradients are active, where the first and second encoding gradients define a non-Cartesian encoded plane, and where the third encoding grading is configured as an encoding gradient varying in a direction perpendicular to the non-Cartesian encoded plane in the object to be imaged, controlling the MRI apparatus to apply the first and second gradients to create the non-Cartesian encoded plane and to apply the third gradient while acquiring the calibration data set, controlling the MRI apparatus to vary the third encoding gradient in an amount sufficient to produce three or more differences in the encoding gradient in consecutive acquisitions; and controlling the MRI apparatus to perform a through-time generalized auto-calibrating partially parallel acquisition (GRAPPA) calibration, where performing the through-time GRAPPA calibration includes computing a GRAPPA weight set from data in the calibration data set, where computing the GRAPPA weight set is based, at least in part, on data acquired while the first and second gradients are being applied and where data acquired with different third gradients comprise unique calibration frames.

2. The non-transitory computer-readable storage medium of claim 1, the method comprising:

controlling the MRI apparatus to acquire an under-sampled data set from the object to be imaged, where the third gradient is configured to produce incoherency between members of the calibration data set and members of the under-sampled data set produced by a moving portion of the object to be imaged; and controlling the MRI apparatus to reconstruct an image of the object to be imaged from the under-sampled data set, where a value for a point missing from k-space in the under-sampled data set is computed using the GRAPPA weight set.

3. The non-transitory computer-readable storage medium of claim 2, where controlling the MRI apparatus to reconstruct the image comprises controlling the MRI apparatus to reconstruct the image in real-time.

4. The non-transitory computer-readable storage medium of claim 2, where the under-sampled data set is a cardiac cine data set.

5. The non-transitory computer-readable storage medium of claim 2, the method comprising controlling the MRI apparatus to acquire the under-sampled data set with a degree of under-sampling of 4.

6. The non-transitory computer-readable storage medium of claim 2, the method comprising controlling the MRI apparatus to acquire the under-sampled data set with a degree of under-sampling of 8.

7. The non-transitory computer-readable storage medium of claim 2, the method, comprising controlling the MRI apparatus to acquire the under-sampled data set with a degree of under-sampling of 16.

8. The non-transitory computer-readable storage medium of claim 2, where the under-sampled data set is acquired in less than ten seconds.

9. The non-transitory computer-readable storage medium of claim 1, where the calibration data set is a fully-sampled data set.

10. The non-transitory computer-readable storage medium of claim 1, where performing the through-time GRAPPA calibration includes computing a value for a point missing from k-space in the under-sampled data set using a GRAPPA weight set calibrated and applied for the missing point.

11. The non-transitory computer-readable storage medium of claim 1, where the GRAPPA weight set is computed from data selected from less than all of the data in the calibration data set.

12. The non-transitory computer-readable storage medium of claim 1, where the object to be imaged is one of, a beating heart, and a region of a human vasculature in which blood is flowing, and where the calibration data set is acquired from the object throughout a period of time during which the object moves or is moved.

13. The non-transitory computer-readable storage medium of claim 1, where the object to be imaged is a heart, and where the calibration data set is acquired from a patient in a free-breathing, non-gated manner.

14. The non-transitory computer-readable storage medium of claim 1, where the calibration data set is associated with one or more of, a radial acquisition, a spiral acquisition, and a rosette acquisition.

15. The non-transitory computer-readable storage medium of claim 1, where the calibration data set comprises two or more acquisition path elements for which calibration data is acquired, and where the GRAPPA weight set is computed from the entire calibration data set.

16. The non-transitory computer-readable storage medium of claim 1, where the calibration data set comprises two or more acquisition path elements for which calibration data is acquired, and where the GRAPPA weight set is computed from less than the entire calibration data set.

17. The non-transitory computer-readable storage medium of claim 1, where the calibration data set is an under-sampled data set, and where the method includes determining a GRAPPA-operator from a portion of the calibration data set and filling in a missing portion of the under-sampled data set using the GRAPPA-operator.

18. The non-transitory computer-readable storage medium of claim 1, comprising controlling the MRI apparatus to acquire a single calibration data set and controlling the MRI apparatus to compute the GRAPPA weight set from data in the single calibration data set.

19. A non-transitory computer-readable medium storing computer-executable instructions that when executed by a computer control the computer to perform a method, the method comprising:
controlling a magnetic resonance imaging (MRI) apparatus to acquire, from an object to be imaged, throughout a period of time, a non-Cartesian fully-sampled 3D calibration data set, where different groups in the calibration data set are acquired at different points in time under different gradient encoding conditions produced by an active gradient applied perpendicular to a non-Cartesian encoded plane in the object to be imaged, where the different gradient encoding conditions cause at least three phase encoding differences between consecutive acquisitions;
controlling the MRI apparatus to acquire an under-sampled non-Cartesian data set from the object to be imaged, where the different gradient encoding conditions produce incoherency between points in the calibration data set and points in the under-sampled non-Cartesian point associated with a moving portion of the object to be imaged; and
controlling the MRI apparatus to reconstruct an image of the object from the under-sampled non-Cartesian data set based, at least in part on a through-time non-Cartesian GRAPPA calibration, where a value for a point missing from k-space in the under-sampled non-Cartesian data set is computed using a GRAPPA weight set calibrated and applied for the missing point, where the GRAPPA weight set is computed from data in two or more different gradient encoding conditions, and where the two or more different gradient encoding conditions are treated as unique calibration time frames as a function of the different gradient encoding conditions.

20. A magnetic resonance imaging (MRI) apparatus, comprising:
a first calibration logic that acquires a calibration data set from an object to be imaged, the first calibration logic being configured: to control the first and second encoding gradients to define a non-Cartesian encoded plane, to control the third encoding gradient to vary in a direction perpendicular to the non-Cartesian encoded plane in the object to be imaged; and to control the MRI apparatus to acquire the calibration data set while the non-Cartesian encoded plane is active and while the third encoding gradient is varying in an amount sufficient to produce three or more differences in the encoding gradient in consecutive acquisitions; and
a second calibration logic that computes a GRAPPA weight set from data in the calibration data set, where data in the calibration data set that was acquired with different third gradients is treated as unique calibration frames.

21. The MRI apparatus of claim 20, comprising:
an under-sampling acquisition logic that acquires an under-sampled data set from the object to be imaged; and
a reconstruction logic that reconstructs an image from the under-sampled data set based, at least in part on the GRAPPA weight set.

22. The apparatus of claim 21, where the GRAPPA weight set is computed from one or more of, data selected from all of the groups of lines in the calibration data set, and data selected from less than all of the groups of lines in the calibration data set.

23. The apparatus of claim 21, where the first calibration logic acquires a non-Cartesian calibration data set comprising two or more acquisition path elements for which calibration data is acquired.

24. The apparatus of claim 23, where the two or more acquisition path elements are selected based on reconstruction elements that will be used to reconstruct the image, and where the two or more acquisition path elements include at least the reconstruction elements that will be used by the reconstruction logic to reconstruct the image and that will be used by the second calibration logic to compute the GRAPPA weight set.

* * * * *

UNITED STATES PATENT AND TRADEMARK OFFICE
CERTIFICATE OF CORRECTION

| | | |
|---|---|---|
| PATENT NO. | : 9,069,051 B2 | Page 1 of 2 |
| APPLICATION NO. | : 13/549158 | |
| DATED | : June 30, 2015 | |
| INVENTOR(S) | : Griswold et al. | |

It is certified that error appears in the above-identified patent and that said Letters Patent is hereby corrected as shown below:

Title page, and in the Specification, in column 1, line 1, in the Title:

Replace "THROUGH TIME GRAPPA" WITH --THROUGH-TIME GRAPPA--.

In the Specification:

In column 2, line 64, delete "data have" and insert --data scan have--.

In column 4, line 39, delete "Figure one" and insert --FIG. 1--.

Figure 2:
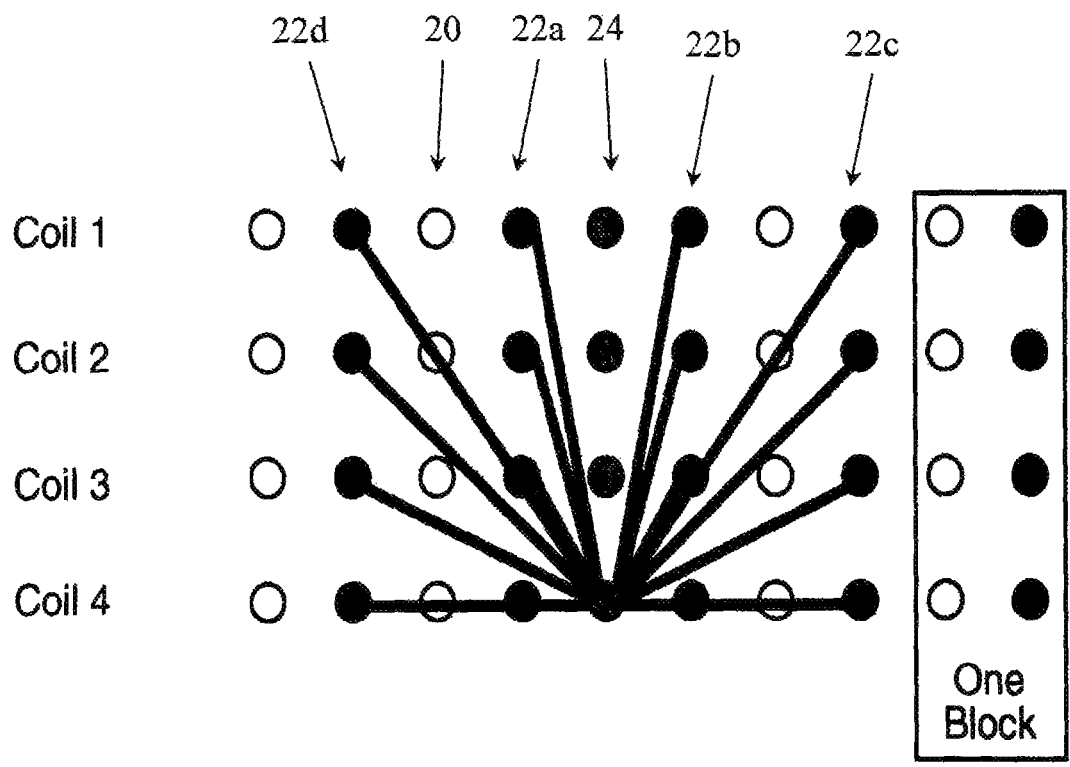
FIG. 2 illustrates a basic generalized auto-calibrating partially parallel acquisition (GRAPPA) algorithm.

In column 4, line 58, delete "Figure two" and insert --FIG. 2--.

In column 4, line 60, delete "Figure two" and insert --FIG. 2--.

In column 9, line 58, delete "dataset" and insert --data set--.

In column 9, line 60, delete "dataset" and insert --data set--.

In column 9, line 67, delete "grading" and insert --gradient--.

In column 10, line 61, delete "dataset" and insert --data set--.

In column 14, line 27, delete "is appreciated" and insert --is to be appreciated--.

In column 17, line 38, delete "B) it" and insert --B), it--.

In column 17, line 40, delete "both" then" and insert --both", then--.

Signed and Sealed this
Seventeenth Day of November, 2015

Michelle K. Lee
*Director of the United States Patent and Trademark Office*

CERTIFICATE OF CORRECTION (continued)
U.S. Pat. No. 9,069,051 B2

In the Claims:

In column 17, line 64, Claim 1, delete "grading" and insert --gradient--.

In column 18, line 47, Claim 7, delete "method, comprising" and insert --method comprising--.

In column 20, line 36, Claim 21, delete "part on" and insert --part, on--.